United States Patent [19]
Lin et al.

[11] Patent Number: 5,318,924
[45] Date of Patent: Jun. 7, 1994

[54] NITRIDATION OF TITANIUM-TUNGSTEN INTERCONNECTS

[75] Inventors: Jung Lin, Cupertino; John E. Turner, Woodside, both of Calif.

[73] Assignee: Hewlett-Packard Company, Palo Alto, Calif.

[21] Appl. No.: 8,052

[22] Filed: Jan. 22, 1993

Related U.S. Application Data

[63] Continuation of Ser. No. 770,592, Oct. 3, 1991, abandoned.

[51] Int. Cl.⁵ .......................................... H01L 21/283
[52] U.S. Cl. .................................. 437/192; 437/190; 437/195; 437/200; 257/764
[58] Field of Search ............... 437/190, 192, 200, 195; 257/764

[56] References Cited

U.S. PATENT DOCUMENTS

| | | | |
|---|---|---|---|
| 4,429,011 | 1/1984 | Kim et al. | 148/33.5 |
| 4,632,725 | 12/1986 | Hartmann et al. | 156/643 |
| 4,676,866 | 6/1987 | Tang et al. | 156/643 |
| 4,701,349 | 10/1987 | Koyanagi et al. | 437/241 |
| 4,782,380 | 11/1988 | Shankar et al. | 357/71 |
| 4,784,973 | 11/1988 | Stevens et al. | 437/200 |
| 4,787,958 | 11/1988 | Lytle | 437/192 |
| 4,847,111 | 7/1989 | Chow et al. | 427/38 |
| 4,855,798 | 8/1989 | Imamura et l. | 437/200 |
| 4,884,123 | 11/1989 | Dixit et al. | 357/71 |
| 4,920,071 | 4/1990 | Thomas | 437/188 |
| 4,927,505 | 5/1990 | Sharma et al. | 204/34.5 |
| 4,957,590 | 9/1990 | Douglas | 156/643 |
| 4,994,402 | 2/1991 | Chiu | 437/41 |
| 5,047,367 | 9/1991 | Wei et al. | 437/200 |
| 5,164,331 | 11/1992 | Lin et al. | 437/192 |
| 5,190,893 | 3/1993 | Jones, Jr. et al. | 437/192 |

OTHER PUBLICATIONS

Alperin, M., et al., "Development of the Self . . . ", *IEEE Trans. Elec. Dev.*, vol. ED 32, No. 2, Feb. 1985, pp. 141-149.

Primary Examiner—T. N. Quach

[57] ABSTRACT

A method of forming interconnects for submicron integrated circuits that allows use of titanium-tungsten as the interconnect material. The inherent instability of titanium-tungsten to oxidation is addressed by a nitridation process that includes exposing the interconnect to an ambient containing nitrogen ($NH_3$) at an elevated temperature. Typically, the process is a rapid thermal anneal. A local interconnect may be formed, whereafter an insulating layer can be deposited at a high temperature without causing oxidation within the local interconnect that would adversely affect the resistivity of the material.

8 Claims, 4 Drawing Sheets

NITRIDATION OF TITANIUM-TUNGSTEN INTERCONNECTS

CROSS REFERENCE TO RELATED APPLICATION(S)

This is a continuation of copending application Ser. No. 07/770,592 filed on Oct. 3, 1991, now abandoned.

TECHNICAL FIELD

The present invention relates generally to methods of providing interconnects for semiconductor integrated circuits and more particularly to methods of providing interconnects to device regions of a semiconductor circuit.

BACKGROUND ART

Fundamental to the fabrication of integrated circuits is the formation of metallization layers to establish electrical communication within the circuit, as well as to external circuitry. A "chip level" interconnect is a metallization layer for electrically connecting device electrodes, e.g. source, drain, gate, base, emitter or collector. A "packaging" interconnect is a metallization layer to provide electrical contact between a chip level interconnect and an input/output lead.

On a large scale, aluminum metallization is typically used as the interconnect layer at both the chip and packaging levels. Aluminum is easily vacuum-deposited and has a high conductivity. Aluminum alloys may also be chosen for different performance-related reasons. Particularly in the area of packaging interconnects, a well-developed technology exists for the deposition and patterning of these metallization layers.

As circuit density increases, the contact area of a device electrode becomes one of the limiting factors for circuit density and performance. A local interconnect is a chip level interconnect that increases circuit density by providing contact between local polysilicon gate and source/drain regions, as well as contact between intra-device source/drain regions, without requiring the formation of contact holes. By eliminating the need for contact holes, the local interconnects reduce parasitic capacitance and enhance circuit performance.

While local interconnects provide improvements in semiconductor integrated circuit chip technology, process complexities and control difficulties have limited the use of local interconnects. U.S. Pat. No. 4,957,590 to Douglas describes alternative methods of forming local interconnects. One described method, credited as a Hewlett-Packard Corporation invention, is to use a silicide as the local interconnect material. A layer of titanium is deposited over a substrate and, prior to the direct reaction of the titanium with any underlying silicon and polysilicon to form titanium silicide, a thin layer of amorphous silicon is patterned on top of the titanium metal to define an interconnect extending over a silicon dioxide region separating two electrode regions to be interconnected. The patterned silicon layer forms a silicide across the silicon dioxide region upon reacting of the titanium with the silicon. One potential difficulty with this method is that it requires deposition and patterning of an additional layer of silicon to define the local interconnections. A second difficulty is that the titanium silicide is a poor diffusion barrier to conventional semiconductor dopants, such as phosphorous and arsenic. Thus, where the silicide is used to connect n-type regions to p-type regions, any subsequent processing must be performed at relatively low temperatures to minimize the counterdoping that potentially could take place through the silicide interconnect.

The Douglas patent teaches that titanium nitride is a preferred material for forming local interconnects, but that using standard fluorine-based chemistries in plasma etching the titanium nitride provides unacceptable selectivity for achieving submicron geometries. The Douglas patent notes that carbon tetrafluoride ($CF_4$) etches titanium nitride at twice the rate of titanium silicide, but also etches silicon oxides and photoresists at a rate faster than the titanium nitride. To increase selectivity, Douglas teaches use of a chlorine-bearing agent as a plasma etchant. However, titanium nitride can be difficult to deposit, so that submicron geometries are still difficult to achieve.

Titanium-tungsten is another possible material for fabrication of local interconnects. However, titanium-tungsten is unstable with respect to oxidation. Formation of a local interconnect is followed by fabrication steps which inevitably require high temperatures, such as formation of phosphosilicate glass layers at a temperature of 800° C. The inherent instability of titanium-tungsten with respect to oxidation would result in reactions occurring in the titanium-tungsten film to form a titanium oxide and a tungsten oxide. Because oxidation affects the resistivity of the film, the performance of the integrated circuit would be adversely affected.

It is an object of the present invention to provide a method of forming interconnects, particularly interconnects that contact exposed regions of a semiconductor wafer, wherein the formed interconnects are stable with respect to oxidation and have a low, reproducible sheet resistance and wherein the method is not critically dependent upon process parameters and requires no new tools or technologies. It is a further object to provide a method to form such interconnects that exhibit increased diffusion-inhibiting characteristics.

SUMMARY OF THE INVENTION

The above objects have been met by a method of providing an interconnect that is a titanium-tungsten film in which dangling bonds of the highly reactive titanium material are tied up in order to reduce the susceptibility of the interconnect to oxidation and diffusion. A substantially uniform and reproducible atomic concentration of nitrogen is provided by exposing the surface of the titanium-tungsten to a heated ambient containing ammonia ($NH_3$).

In a preferred embodiment a doped region of a semiconductor wafer is reacted with a refractory metal, such as titanium, to form a silicide. The doped region is an electrode region of a field effect transistor or a bipolar transistor. A film of titanium-tungsten is sputter deposited on the semiconductor wafer, whereafter the titanium-tungsten is patterned to form the interconnect. The wafer is then heated and exposed to an ammonia-containing ambient for a period of time and at a temperature which provides a relatively high concentration of nitrogen at an upper surface and a substantially uniform concentration below the upper surface. Rapid thermal annealing may be used in nitriding the titanium-tungsten layer.

In the preferred embodiment, a local interconnect is formed. The method steps of deposition, patterning and nitridation of the titanium-tungsten layer are not process sensitive. That is, the method is not critically dependent upon temperature or other process parameters. Moreover, the sheet resistance of the nitrided titanium-tungsten layer is low. For a rapid thermal annealing of the titanium-tungsten at 700° C. in NH3, the sheet resistance is approximately 10 ohms/square. More importantly, the nitridation provides a local interconnect which is stable within an oxidizing environment at elevated temperatures.

Prior art methods of introducing nitrogen into an integrated circuit chip metallization are (1) providing nitrogen (N2) into the atmosphere during the sputter deposition of the metal and (2) backsputtering of the metal with N2 after deposition. The first of these methods is described in U.S. Pat. No. 4,927,505 to Sharma et al., which teaches a five-layered metal assembly. One of the five metallization layers is titanium-tungsten-nitride (TiWN) formed by sputtering titanium-tungsten in the presence of N2 and argon. U.S. Pat. No. 4,847,111 to Chow et al. teaches chemically vapor depositing a layer of tungsten, whereafter the tungsten is plasma nitrided to form a tungsten nitride layer. It is believed that the present invention of utilizing NH3 to form a nitrided titanium-tungsten achieves a more uniform and reproducible layer.

In another embodiment, the nitridation of titanium-tungsten using NH3 may be utilized to provide a diffusion barrier. Source and drain regions of a device require the free flow of carriers between an n-doped or p-doped silicon wafer region and a metallization of aluminum or an aluminum alloy. However, direct contact between the metallization and the underlying silicon results in electromigration of the silicon into the aluminum and undesirable junction spiking. Thus, it is known to use thin layers of titanium-tungsten on opposite sides of the aluminum layer. The top titanium-tungsten layer serves to minimize electromigration and hillock formation, as well as forming an antireflective surface for photolithographic purposes. Aluminum has a poor step coverage, so that the bottom titanium-tungsten layer is used to improve metallization step coverage, as well as serving as a barrier layer to minimize aluminum and silicon interdiffusion. The nitrided titanium-tungsten layer that results from employing the present invention improves the barrier metal properties of the layer. In comparison to Sharma et al., the nitrided titanium-tungsten layer is preferably in contact with the silicon wafer.

A third use of nitrided titanium-tungsten interconnects processed in accord with the present invention is a "strap" from a source/drain region to an intermediating polysilicon pad described in U.S. Pat. No. 4,994,402 to Chiu and assigned to the assignee of the present invention. The Chiu patent is hereby incorporated herein. Chiu teaches the use of the intermediating polysilicon pad in order to allow a single level metallization to be used for all contacts, including gate, source and drain electrode regions. The technical challenge in implementing the invention of Chiu is using a stable and conformal "strapping" material between the source/drain region and the polysilicon pad. The nitrided titanium-tungsten is preferred over the titanium material of Chiu because it provides an improved stability to oxidation. Moreover, following dielectric deposition and contact etch, the nitrided titanium-tungsten may be used as a nucleation site for via-fill with selective or blanket tungsten deposition.

BEST MODE FOR CARRYING OUT THE INVENTION

Figure 1:
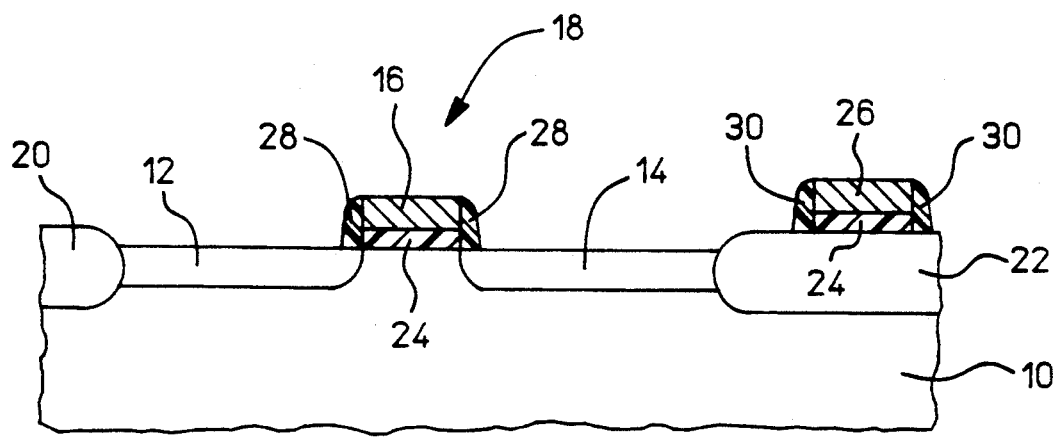
FIGS. 1-4 and FIG. 6 are side sectional views of a fabrication process for forming interconnects in accord with the present invention.
Figure 2:
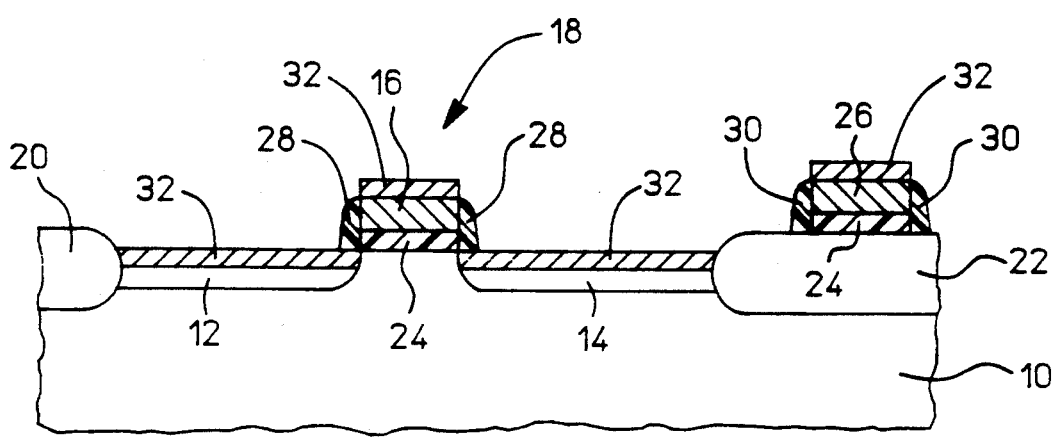

With reference to FIG. 1, a semiconductor substrate 10 is shown as including a source region 12, a drain region 14 and a gate region 16. While the present invention will be described and illustrated as used with CMOS devices, the invention may be employed with other integrated circuit devices, including bipolar devices. "Electrode regions" will be defined as including source, drain, gate, emitter, base and collectors within an integrated circuit.

The source, drain and gate regions 12-16 define a transistor 18. The source and drain regions are diffusion areas of the semiconductor substrate 10. Typically, the substrate is silicon. The transistor 18 is fabricated within an island defined by field oxide regions 20 and 22.

The gate region 16 is disposed atop a patterned gate oxide layer 24. The patterned gate oxide layer 24 includes a partial covering of one of the field oxide regions 22, thereby spacing apart the field oxide region from a polysilicon layer 26. Typically, the polysilicon layer 26 is deposited and patterned simultaneously with the polysilicon gate region 16. The polysilicon layer 26 is contiguous with a gate region of a second transistor. Because the field oxide region 22 is a dielectric material, the portion of the gate oxide layer 24 below the polysilicon layer 26 is not critical.

Oxide sidewall spacers 28 and 30 on the opposed sides of the gate region 16 and the polysilicon layer 26 protect the sidewalls of the polysilicon members 16 and 26 against "bridging" during a self-aligning silicide process. A refractory metal is blanket deposited across the substrate of FIG. 1. Titanium is a preferred metal, since titanium exhibits the lowest resistivity of the refractory metal silicides and since it is able to reliably form a silicide on both polysilicon and single-crystal silicon by thermal reaction. However, other refractory metals may be used. The blanket layer is then treated to react the refractory metal with underlying silicon and polysilicon material. Any of a number of methods may be utilized. In rapid thermal processing (RTP) titanium disilicide is formed at a temperature within the range of 600° C. to 950° C. No reaction takes place at the oxide sidewall spacers 28 and 30 or at the field oxide regions 20 and 22. Unreacted titanium and titanium nitride are then removed, leaving titanium disilicide 32 at the source region 12, the drain region 14, the gate region 16 and the polysilicon layer 26. The self-aligned titanium disilicide (TiSi2) 32 process reduces the gate and source/drain sheet resistance to less than three ohms/square.

Figure 3:
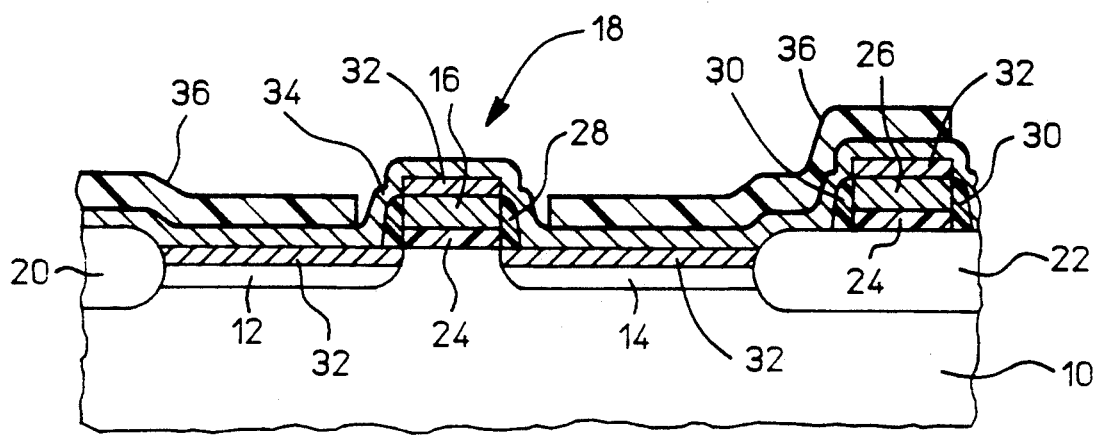

Preferably, the surface of the semiconductor substrate 10 is then cleaned to ensure a low resistance contact with a subsequent deposit of titanium-tungsten 34, shown in FIG. 3. The titanium-tungsten layer 34 is sputter deposited using techniques well known in the art. A preferred thickness for the forming of a local interconnect is 100 nm. Typically, the layer 34 is approximately 20 atomic % titanium and 80 atomic % tungsten. In a manner well known in the art, a layer 36 of photoresist is deposited and patterned to coat only regions of the titanium-tungsten that are to form local interconnects.

In the past, etching of titanium-tungsten on TiSi$_2$ was by a wet dip in a mixture of H$_2$O$_2$ and H$_2$SO$_4$, or a mixture of H$_2$O$_2$ and HF with H$_2$O, or by plasma etching with CF$_4$ and O$_2$ gases. However, these methods suffer from process problems, including undercuts of line width using either plasma etch or wet solution. In addition, the manufacturing process is not easily controlled.

Here, CHF$_3$ and O$_2$ gases are used, enhancing selectivity to the extent that titanium-tungsten may now be utilized in the formation of local interconnects. However, the first step is to remove oxide on the titanium-tungsten layer 34 in order to improve control of the etching characteristics. Titanium oxide is removed by the use of Cl$_2$ and CF$_4$ gases. Carbon tetrafluoride (CF$_4$) is introduced at a flow rate of approximately 40 SCCM, while Cl$_2$ is introduced at approximately 10 SCCM. A pressure of 35 motor and a bias of $-260$ volts is applied for an etching time of two minutes. It has been discovered that without removing the oxide from the titanium-tungsten layer, the gas combination of CHF$_3$ and O$_2$ will not controllably etch away the oxide and pattern the titanium-tungsten. That is, the titanium oxide acts as a protective layer.

Removing the titanium oxide is a first main issue in the process development. The second main issue is achieving a high etching selectivity of the titanium-tungsten layer 34 over the silicide 32. High selectivity has been achieved with the use of the CHF$_3$ and O$_2$ gases. However, any residue of the Cl$_2$ gas must first be removed from the process chamber. One choice of process chambers is Applied Materials' metal etcher model No. 8130. However, other chambers may be employed. Cl$_2$ gas must be removed since even a small amount can react with the TiSi$_2$ to form titanium chlorides which are highly volatile. Residue can be removed by flushing the process chamber with either nitrogen or other process gases, such as one or both of CHF$_3$ or O$_2$ gas. Alternatively, the semiconductor substrate 10 can be transferred from one process chamber to a second process chamber in order to avoid cross contamination.

After removal of the titanium oxide, the titanium-tungsten layer 34 is plasma etched. A conventional photoresist layer 36 is employed. Best results have been achieved by a 40 SCCM flow of CHF$_3$ and a 50 SCCM flow of O$_2$ at an electrode bias of $-260$ volts and at a pressure of 35 motor. The resulting etch rate is approximately 500 angstroms/min. The etch selectivity with respect to the silicide 32 is 10:1 while the selectivity with respect to oxide is approximately 4:1. Because the protective oxide has been removed from the surface of the titanium-tungsten, the etch rate varies significantly with a change in the amount of O$_2$ in the process. A preferred range of flow of O$_2$ is 40–60 SCCM. Preferred ranges of CHF$_3$ flow and process pressure are 35–45 SCCM and 30–40 motor, respectively.

Since the titanium-tungsten layer 34 is disposed over the polysilicon gate region 16 and layer 26 in the field oxide topography, significant overetch is required to the remove titanium-tungsten from oxide sidewall spacers 28. While wet chemical etch can achieve excellent titanium-tungsten etch selectivity, dry etch is preferred to prevent undercutting and to minimize CD loss. Experimentation indicates that a 100% overetch is sufficient to clear titanium-tungsten from oxide sidewall spacers surrounding the polysilicon and field oxide topography. However, even an overetch of 300% has a negligible effect on the sheet resistance of the silicide 32.

Figure 4:
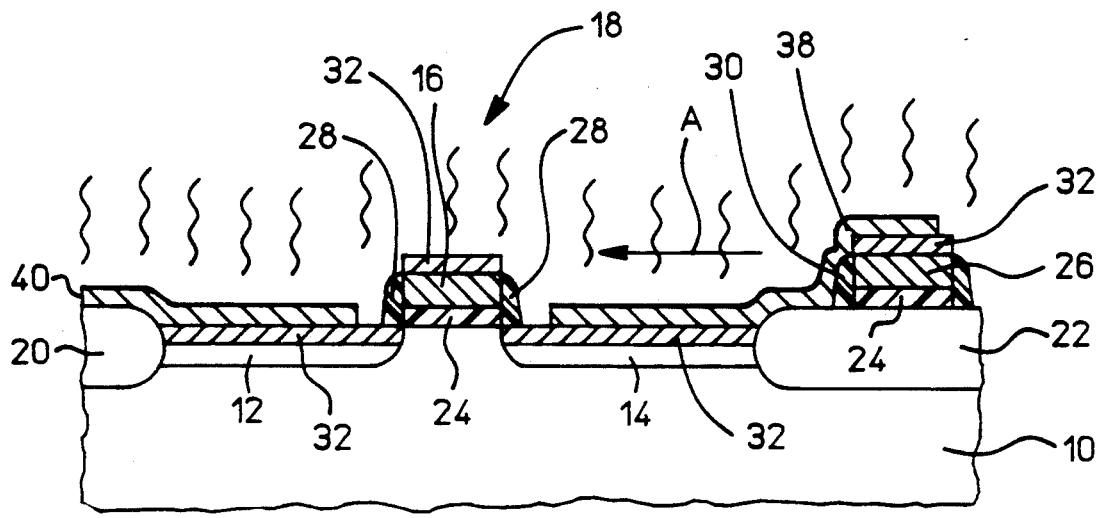

Referring now to FIG. 4, the photoresist is then removed using standard techniques, thereby exposing a pair of local interconnects 38 and 40. The device characteristics of the transistor 18, e.g. threshold voltage and source/drain series resistance, are approximately the same as prior to formation of the titanium-tungsten local interconnects 38 and 40. In general, the results indicate little or no degradation caused by titanium-tungsten dry etch.

The main reason for adopting local interconnect technology is to increase the circuit packing density. The addition of a titanium-tungsten local interconnect allows direct butting contact between a polysilicon gate and doped source/drain regions, thereby greatly reducing the size of an integrated circuit. In one case, the cell area of a CMOS SRAM cell was reduced by approximately 40%. The elimination of contact holes on a source/drain region also reduces the junction area and any parasitic capacitance.

The above-described etching process provides vertical film edges for titanium-tungsten local interconnects 38 and 40. Vertical film edges are required for submicron geometries in the fabrication of semiconductor integrated circuits. The vertical film edges have been attributed to the use of CHF$_3$ gas that produces a polymer layer and has a tendency to protect the interconnect sidewalls during the titanium-tungsten etch process.

As noted above, one reason that titanium-tungsten has not been accepted as a preferred material for formation of local interconnects 38 and 40, is the poor etch selectivity exhibited by prior art etching methods. A second reason is the instability of titanium-tungsten with respect to oxidation. Following formation of the local interconnects 38 and 40, a dielectric material is deposited. Unavoidably, the deposition of the dielectric requires high temperature steps. Employing conventional technology, the result is a formation of oxide at the local interconnect level. A reaction occurring within the titanium-tungsten film causes the constituent materials to combine with oxygen, forming titanium oxide and tungsten oxide. The film then no longer exhibits the same resistivity. In comparison to the prior art, the present method passivates the titanium-tungsten layer to minimize the effects of oxidation. The dangling bonds of the film are tied up by the introduction of nitrogen. Two methods of introducing nitrogen are (1) backsputtering of the film with N$_2$ after deposition of the film and (2) introducing N$_2$ into the ambient during sputter deposition of the film. However, neither of these two methods provides the desired reproducibility of film quality and a desired control of nitrogen concentration.

As shown in FIG. 4, in the present invention a flow of ammonia (NH$_3$) is directed along Arrow A to present a NH$_3$ ambient for a nitridation of the local interconnects 38 and 40. In a preferred embodiment, the process is a rapid thermal anneal at a temperature of 700° C. for a period of 60 seconds. However, desirable results are achieved within a range of 600° C.–900° C. The 100 nm thick layer of titanium-tungsten of the local interconnects 38 and 40 should be exposed to the NH$_3$ ambient for at least 30 seconds. The preferred flow rate is 5 liters/min.

Figure 5:
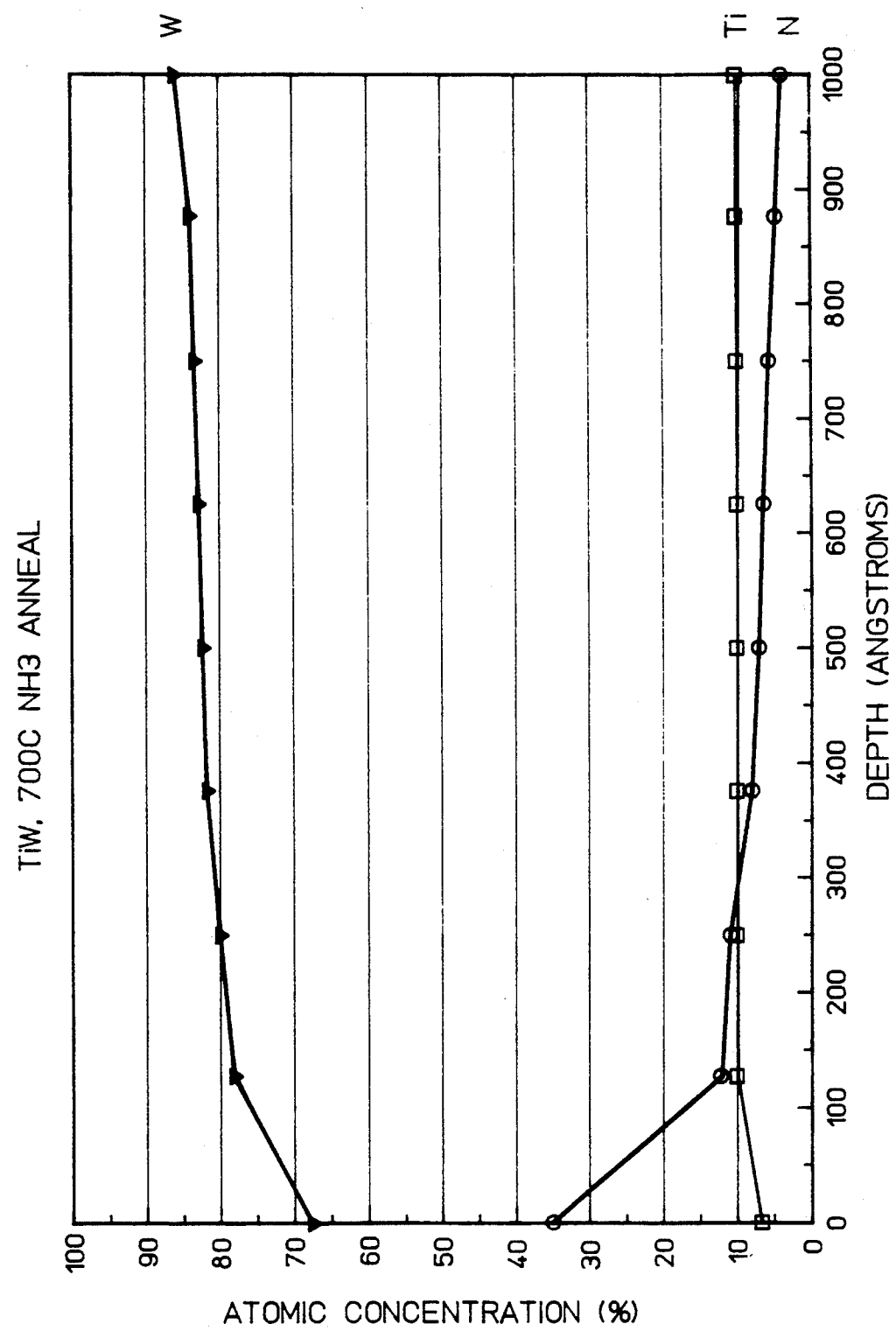
FIG. 5 is a graph of concentrations of constituents of the interconnect of FIG. 6.

An Auger depth profile is shown in FIG. 5 for an anneal at a temperature of 700° C. The surfaces of the titanium-tungsten local interconnects are somewhat nitrogen enriched within the bulk of the film, the atomic concentrations of the three constituents of the nitrided titanium-tungsten are relatively constant. It has been demonstrated that the results of FIG. 5 are reproducible without requirement of great attention to process parameters.

Resistivity measurements of identical titanium-tungsten films show a corresponding gradual and monotonic increase in resistivity as the nitrogen content is increased. At the preferred temperature of 700° C., the sheet resistance is approximately ten ohms/square, an increase from approximately six ohms/square achieved by using a rapid thermal anneal temperature of 600° C. At 900° C., the sheet resistance rises to approximately twenty-three ohms/square. All of the above-cited measurements are for titanium-tungsten films having a thickness of 100 nm and are within acceptable limits.

Experimentally, the same nitridation process as described above was performed with a substitution of N$_2$ for the NH$_3$. Even when the temperature was raised above 900° C., an insufficient amount of nitrogen entered the titanium-tungsten film to approach the desirable results obtained by utilizing NH$_3$.

Figure 6:
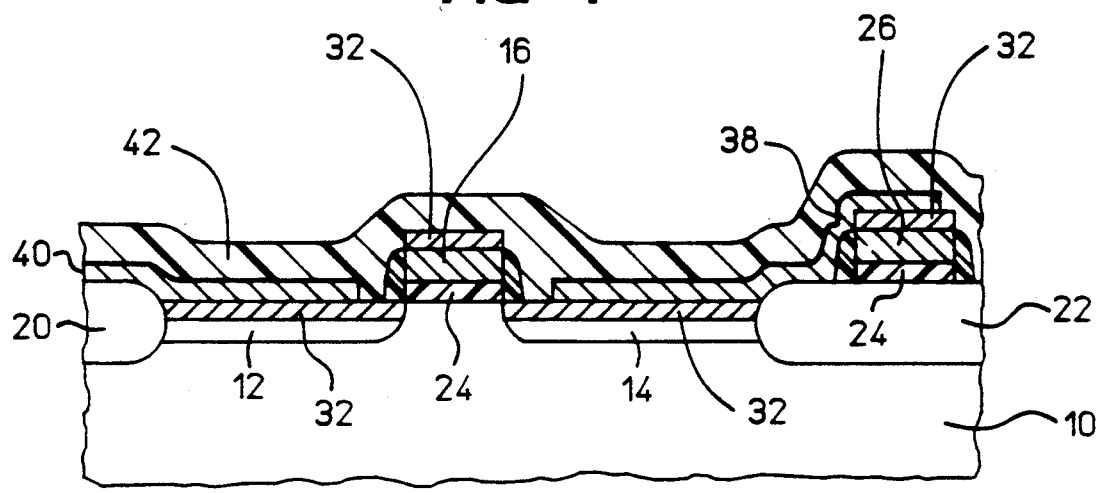

One benefit of the method of titanium-tungsten deposition, patterning and nitridation is that standard sputter deposition equipment, lithography tools and rapid thermal processing chambers may be utilized. More importantly, the etch selectivity provides a vertical profile for the side walls of the local interconnects 38 and 40. Nitridation allows deposition of a dielectric layer 42, shown in FIG. 6, without adverse effects to the resistivity of the local interconnects.

Figure 7:
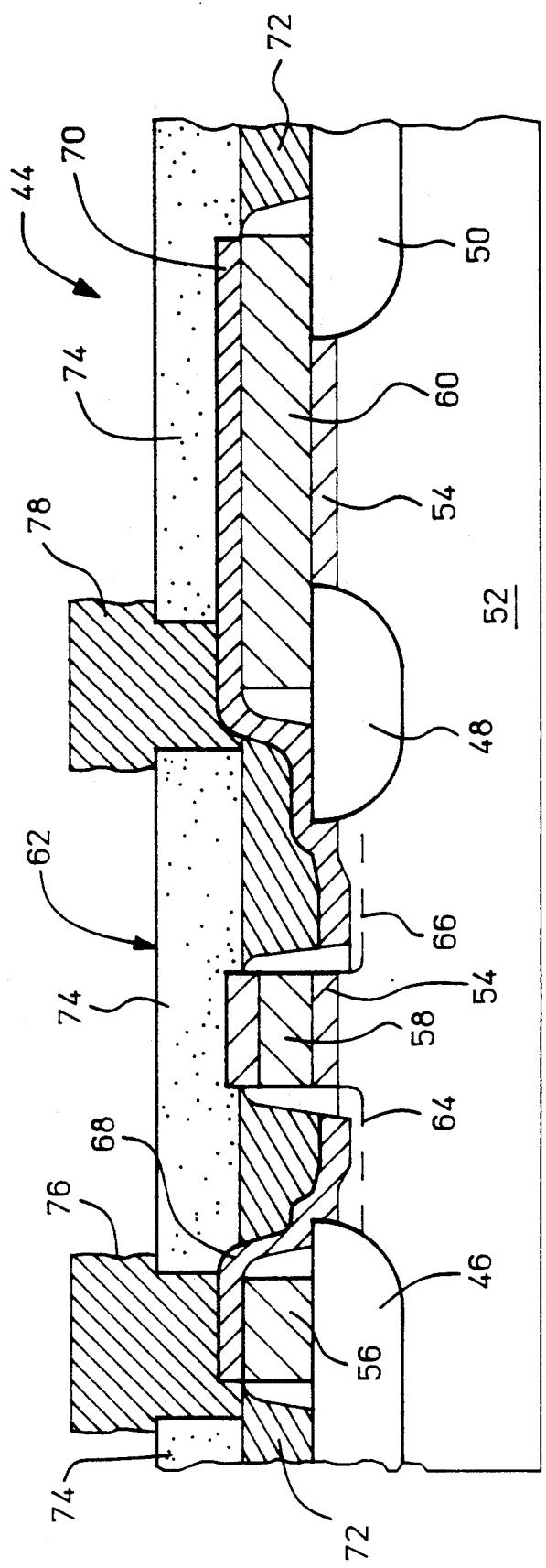
FIG. 7 is a second embodiment of the present invention.

Referring now to FIG. 7, a second embodiment of the present invention is shown. U.S. Pat. No. 4,994,402 to Chiu and assigned to the assignee of the present application, teaches a coplanar self-aligned contact structure in a semiconductor device 44. The Chiu patent is incorporated herein by reference. Three field oxide regions 46, 48 and 50 are formed in a planar surface of a semiconductor substrate 52. A gate oxide layer 54 is grown in the regions between the field oxide regions. Three coplanar polysilicon pads 56, 58 and 60 are deposited, with the first polysilicon pad 56 overlying the first field oxide region 46, with the third polysilicon pad 60 overlying the second and third field oxide regions 48 and 50, and the center polysilicon pad 58 within the island region that defines a transistor 62. A source region 64 and a drain region 66 are on opposite sides of the center polysilicon pad 58.

A refractive metal is deposited to coat the polysilicon pads 56, 58 and 60 and the remainder of the substrate 52. A reactive layer, such as amorphous silicon, is then used to coat those portions of the refractive metal that do not have an underlying contact with the silicon substrate 52 or a polysilicon pad 56–60, but that are necessary to form conductive paths 68 and 70 from the source/drain regions 64 and 66 to the top surface of the first and third polysilicon pads 56 and 60. The refractive metal is then caused to react with the silicon substrate, the polysilicon pads and the reactive layer. Unreacted refractive metal is removed. First and second dielectric layers 72 and 74 are then deposited, and contact holes etched through the second dielectric layer 74 allow formation of electrical contacts 76 and 78.

The Chiu patent teaches that the refractive metal used to form the conductive paths, or "straps," 68 and 70 may be tungsten, titanium, cobalt, nickel or molybdenum, or a noble metal such as platinum or palladium. However, the nitridation step described above provides a material, i.e. nitrided titanium-tungsten, that is stable with respect to oxidation, that can be used to provide a nucleation site for a selective deposition of tungsten in forming the electrical contacts 76 and 78, and that is not process sensitive.

Figure 8:
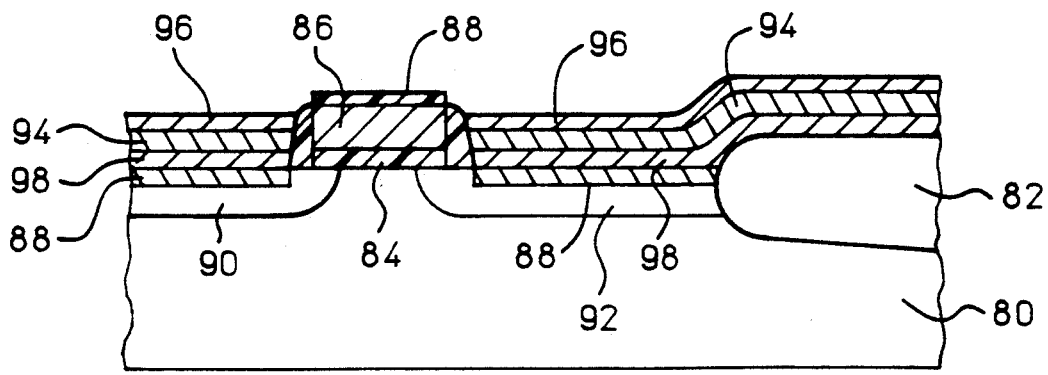
FIG. 8 is a third embodiment of the present invention.

FIG. 8 illustrates a third embodiment of the use of the nitridation process. A semiconductor substrate 80 includes a field oxide region 82, a gate oxide layer 84, and a polysilicon gate region 86. In a manner described above, silicide 88 is formed within source and drain regions 90 and 92 and atop the gate region 86.

In contrast to the embodiments of FIGS. 1–7, here the interconnect is a multilayered path consisting of a center aluminum-copper layer 94 between two titanium-tungsten layers 96 and 98. As is known in the art, the top layer 96 of titanium-tungsten provides an anti-reflection coating for subsequent photolithography and also reduces electromigration and hillock formation. The lower titanium-tungsten layer 98 aids metallization step coverage, has better adhesion to the field oxide 82 than does the aluminum-copper layer 94, and provides a barrier to the diffusion of atoms between the semiconductor substrate and aluminum-copper layer.

While the conventional titanium-tungsten layer acts as a barrier for the interdiffusion of silicon and aluminum, the diffusion-inhibiting characteristics can be improved. A stable, reproducible improvement is provided by nitridation process using the NH$_3$ rapid thermal anneal process described above.

We claim:

1. A method of providing a single-layer local interconnect within an integrated circuit comprising,
   providing a semiconductor wafer having spaced apart first and second electrode regions,
   forming a layer of titanium atop said semiconductor wafer,
   heating said semiconductor wafer, whereby first surface portions of said titanium react to form a silicide and second surface portions of said titanium remain unreacted,
   removing said second surface portions of said titanium, leaving said silicide,
   depositing a titanium-tungsten layer on said semiconductor wafer such that said titanium-tungsten contacts said silicide,
   patterning said titanium-tungsten layer such that a single-layer local interconnect is formed from said first electrode region to said second electrode region,
   nitriding said patterned titanium-tungsten layer, including heating said patterned titanium-tungsten layer and exposing said patterned titanium-tungsten layer to an ambient containing ammonia, thereby forming a nitrided titanium-tungsten interconnect, and
   depositing an insulator layer on said titanium-tungsten interconnect, whereby a single-layer local interconnect is formed.

2. The method of claim 1 wherein said step of nitriding includes rapid thermal annealing at a temperature in the range of 600° C. to 900° C.

3. The method of claim 2 wherein said step of nitriding includes directing said ambient containing ammonia to said titanium-tungsten layer at a flow rate in the range of 3-10 liters/min and for a period in the range of 30 to 90 seconds.

4. A method of forming a local interconnect in a semiconductor integrated circuit comprising, providing a semiconductor wafer having a plurality of electrode regions thereon, depositing a layer of titanium over said electrode regions, forming a silicide on said electrode regions, depositing an interconnect layer of titanium-tungsten on said semiconductor wafer, including depositing said interconnect layer directly onto said silicide, patterning said interconnect layer, including leaving a single-layer local interconnect extending from a first electrode region to a second electrode region, exposing said local interconnect to a heated ammonia-containing ambient, thereby forming at least a portion of said local interconnect into a nitrided titanium-tungsten local layer, and coating said local interconnect with an insulating layer, said insulating layer being deposited directly onto said local interconnect.

5. The method of claim 4 wherein said step of exposing is a step of rapid thermal annealing said local interconnect in a flow of ammonia, said flow being free of gases other than ammonia.

6. The method of claim 4 wherein said step of patterning includes leaving said local interconnect along an electrical path from a first electrode region and atop a field oxide region of said semiconductor wafer to a second electrode region.

7. The method of claim 4 wherein said step of forming said silicide is a step of forming self-aligned titanium disilicide.

8. The method of claim 4 wherein said step of depositing said interconnect layer is a step of sputter depositing titanium-tungsten.

* * * * *